United States Patent [19]
Parrillo et al.

[11] Patent Number: 5,208,168
[45] Date of Patent: May 4, 1993

[54] SEMICONDUCTOR DEVICE HAVING PUNCH-THROUGH PROTECTED BURIED CONTACTS AND METHOD FOR MAKING THE SAME

[75] Inventors: Louis C. Parrillo; Neil B. Henis, both of Austin, Tex.; Richard W. Mauntel, Phoenix, Ariz.

[73] Assignee: Motorola, Inc., Schaumburg, Ill.

[21] Appl. No.: 617,727

[22] Filed: Nov. 26, 1990

[51] Int. Cl.$^5$ .................................... H01L 21/76
[52] U.S. Cl. ........................ 437/26; 148/DIG. 19; 148/DIG. 20; 437/63; 437/75; 437/186; 437/187
[58] Field of Search ............... 437/63, 64, 74, 75, 437/186, 187, 203, 26; 148/DIG. 19, DIG. 20

[56] References Cited

U.S. PATENT DOCUMENTS

| | | | |
|---|---|---|---|
| 3,909,320 | 12/1973 | Cauge et al. | 148/187 |
| 3,996,657 | 12/1976 | Simko et al. | 437/187 |
| 4,079,504 | 3/1978 | Kosa | 437/187 |
| 4,280,855 | 1/1980 | Bertin et al. | 148/1.5 |
| 4,317,273 | 11/1979 | Guterman et al. | 29/571 |
| 4,477,310 | 8/1983 | Park et al. | 156/643 |
| 4,500,898 | 7/1982 | Cline | 357/23 |
| 4,550,490 | 4/1984 | Blossfeld | 29/571 |
| 4,575,920 | 5/1984 | Tsunashima | 29/571 |
| 4,577,391 | 7/1984 | Hsia et al. | 29/571 |
| 4,599,118 | 9/1984 | Han et al. | 148/1.5 |
| 4,613,886 | 9/1986 | Chwang | 357/42 |
| 4,745,454 | 11/1986 | Erb et al. | 357/51 |

FOREIGN PATENT DOCUMENTS

| | | | |
|---|---|---|---|
| 55-22480 | 2/1977 | Japan | 29/78 |
| 56-26471 | 3/1981 | Japan | 29/78 |
| 0010856 | 1/1983 | Japan | 437/63 |
| 2017402 | 10/1979 | United Kingdom | 437/186 |
| 2036431 | 6/1980 | United Kingdom | . |

*Primary Examiner*—Olik Chaudhuri
*Assistant Examiner*—Ourmazd S. Ojan
*Attorney, Agent, or Firm*—Jasper W. Dockrey

[57] ABSTRACT

Adjacent buried contacts (11, 12, 13) formed at the principal surface of a well or substrate region (14) of a semiconductor device, each having a doped contact region (29, 30 31) of one conductivity type and a punch-through prevention region (36, 37, 38) of the opposite conductivity type surrounding the lower portion of the doped contact region are provided. The punch-through prevention region may advantageously be of the same conductivity type as the substrate. By performing an extra implant or other impurity introduction step while the mask to etch the contacts through the dielectric layer remains in place, the procedure to provide punch-through protected buried contacts may be easily integrated into current processes without the need for an extra mask. Such a structure and procedure enables buried contacts to be spaced closely together without over-doping the well region (14) in which source-drain regions (40, 42, 44, 46) are also formed thus avoiding a degradation in device performance.

9 Claims, 4 Drawing Sheets

SEMICONDUCTOR DEVICE HAVING PUNCH-THROUGH PROTECTED BURIED CONTACTS AND METHOD FOR MAKING THE SAME

FIELD OF THE INVENTION

The invention relates to semiconductor devices and a method of fabrication, and more particularly to semiconductor devices having buried contacts to an underlying doped region, such as a source-drain region of an MOS transistor and to methods for their fabrication.

BACKGROUND OF THE INVENTION

In integrated circuits, a common feature is a buried contact, which is a contact of a strip of conductive material such as a metal, metal silicide or doped polycrystalline silicon (polysilicon), to a doped semiconductor substrate region, such as a source/drain region or a well region. The typical procedure in the formation of a buried contact first involves the formation of a plurality of field oxide or isolation regions on and in the surface of a doped well or tub of semiconductor material or on the doped surface of the substrate itself. A dielectric material layer, such as silicon dioxide or the like, is next formed over the substrate and contact holes are cut through the dielectric material. Contact to the substrate is achieved by forming a layer of doped polysilicon extending at least part way into or over the hole, and by diffusing impurity atoms from the polysilicon into the substrate to form a doped contact region in the substrate.

However, as very-large-scale-integration (VLSI) devices are made ever smaller and the number of components in a device increase, contacts, such as buried contacts, located on either side of an isolation region must be placed closer together. The close placement of the buried contacts within a device can result in the overlap of the depletion regions associated with the doped contact region of each contact. The overlap of the depletion regions then results in a leakage current between the contacts. This problem is termed lateral punch-through, and may occur in buried contacts doped with either an n-type or a p-type dopant. Lateral punch-through is a particular problem as device features become smaller and the buried contacts are spaced closer together. Vertical punch-through may also occur, as from a buried contact region through a well of opposite conductivity type to the substrate, which is the same conductivity type as the buried contact regions.

Layers or regions of additional doping around doped regions such as the source and drain regions are not unknown, in general. For example, U.S. Pat. No. 4,613,886 discloses six transistor static-random-access-memory (SRAM) cell wherein a field effect transistor is formed in an n-type well region and a diode is made in the p-type drain region. However, buried contacts, present in the six transistor SRAM cell, are not punch-through protected. In addition, counter doped source and drain regions are known, for example as described in U.K. Pat. 2,036,431 wherein heavily doped regions surround the source and drain regions of a metal-oxide-semiconductor (MOS) transistor. The surrounding features taught by the above cited references are within or part of the individual transistors and are not correctly doped to provide any kind of electrical punch-through prevention. Thus, devices of the prior art do not provide the punch-through prevention function for buried contacts associated with separate devices in close proximity to each other.

SUMMARY OF THE INVENTION

In practicing the invention, there is provided a semiconductor device having a plurality of punch-through protected buried contacts. In accordance with one embodiment of the invention, a semiconductor substrate of a first conductivity type is provided having a principal surface. An isolation region overlies a first portion of the principal surface and a dielectric layer overlies a second portion of the principal surface. A plurality of contact openings are formed in the dielectric layer adjacent to the isolation region. A doped punch-through prevention region of the first conductivity type is located in the substrate below the contact openings. A doped contact region of a second conductivity type extends from the principal surface within each contact opening to the punch-through prevention region separating the punch-through prevention region from the principal surface. At least one conductive layer overlies a portion of the isolation region and a portion of the dielectric layer and extends into at least a portion of the contact openings forming an electrical contact to the doped contact regions in the substrate.

Figure 1:
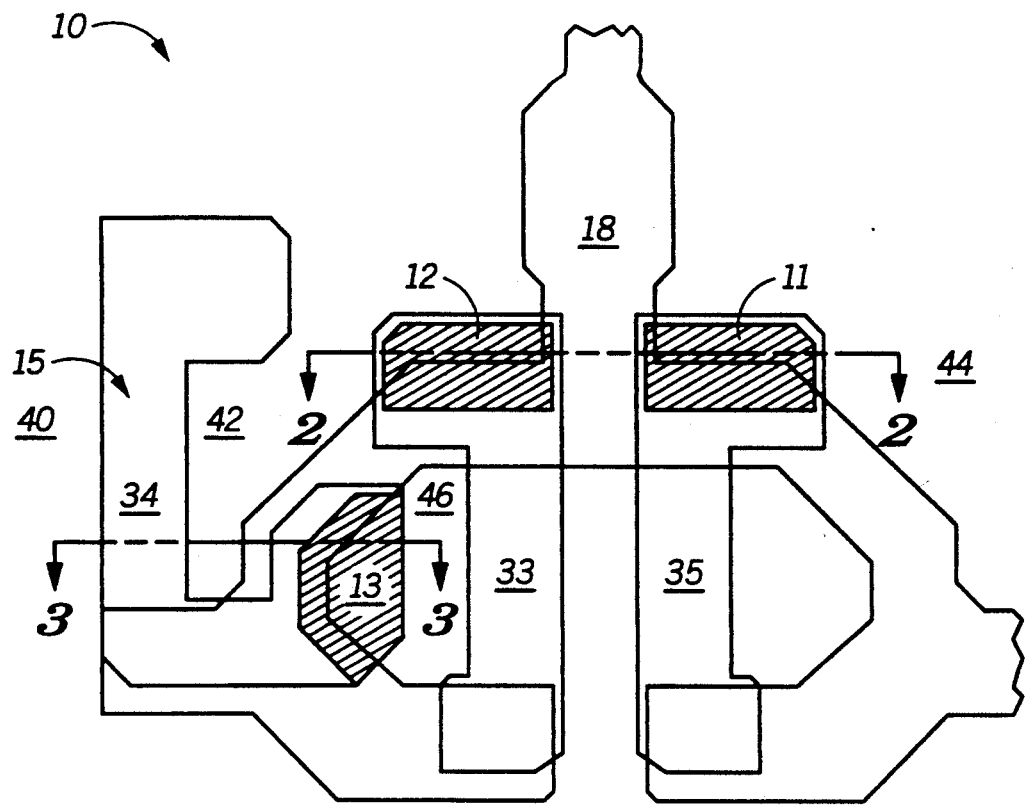
FIG. 1 is a plan view of a circuit portion of a semiconductor device showing a plurality of buried contacts formed in accordance with the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

Detailed Description of a Preferred Embodiment

Within the context of the embodiment described herein, it will be assumed that n-type contacts are being made to n-type source-drain regions formed in a p-type well region within an n-type substrate. The invention also applies to the reverse conductivity type of situation such as p-type contacts being made to p-type source-drain regions formed in an n-type well region within a p-type substrate. Furthermore, in certain applications a well region may not be present and the contact is made directly to doped regions formed in the bulk substrate itself. Moreover, in certain applications the well region can instead be a doped epitaxial layer of semiconductor material overlying a single crystal semiconductor substrate. The approach of the present invention is to locally increase doping levels to avoid leakage currents. This produces an extra region or layer of doping beneath the doped contact regions which is of a different conductivity type than the contact regions, but of the same doping type as the well region or bulk substrate in which the device is fabricated.

Shown in FIG. 1, in plan view, is one embodiment of a circuit portion 10 of a semiconductor device fabricated in accordance with the invention. The features shown in FIG. 1 include buried contacts 11, 12 and 13, a field isolation region 18 and separate conductive layers 33, 34 and 35. A portion of conductive layer 34 forms the gate of an MOS transistor 15 having source-drain regions 40 and 42. Buried contacts 11, 12 and 13 are adjacent to field oxide region 18 and provide means for overlying conductive layers 35, 33 and 34 to make electrical contact with source-drain regions 44, 42 and 46 respectively. Source-drain regions 46 and 44 are associated with other MOS transistors which for clarity of illustration are not shown in FIG. 1. In the particular embodiment illustrated in FIG. 1, the device features are formed in a well region 14 of a single crystal semiconductor substrate 16 and the structure shown is part of a memory array in an SRAM device. However, the present invention can also be used in many different MOS and BiCMOS (bipolar-Complementary-MOS) devices having buried contacts such as BiCMOS SRAM devices, DRAM (dynamic-random-access-memory) devices, microprocessor devices, and the like.

Figure 2:
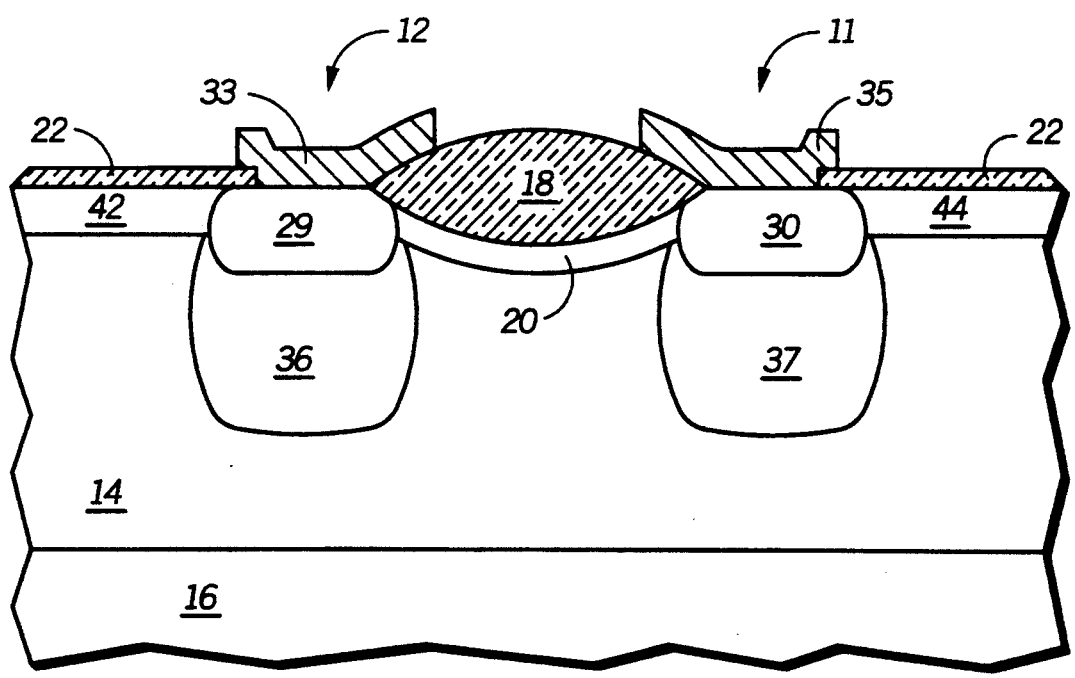
FIG. 2 is a cross sectional view taken along the line 2—2 of FIG. 1 illustrating two adjacent buried contacts formed in accordance with the present invention.

A cross section taken along the line 2—2 is shown in FIG. 2 depicting buried contacts 11 and 12. Doped contact regions 29 and 30 are formed in well region 14 adjacent to field oxide region 18 and overlie doped punch-through prevention regions 36 and 37 respectively. A channel stop 20, located in well region 14, underlies and is coextensive with field isolation region 18. In the cross sectional view of FIG. 2, channel stop 20 can be seen extending between doped contact regions 29 and 30. A pad oxide layer 22 overlies a portion of the surface of well region 14 on either side of field isolation region 18. Conductive layers 33 and 35 overlie a portion of field isolation layer 18 and a portion of a pad oxide layer 22 and make electrical contact to doped contact regions 29 and 30 through contact openings in pad oxide layer 22. In the case of polysilicon conductive layers, formation of an ohmic contact to source-drain regions 42 and 44 is more readily achieved if conductive layers 33 and 35 are of the same conductivity type as doped contact regions 29 and 30.

The inventive structure shown in FIG. 2, offers a distinct advantage over the prior art where the only punch-through protection between adjacent buried contacts is a channel stop such as channel stop 20. The formation of punch-through prevention regions 36 and 37, deep in the well or substrate surrounding the lower portion of contact regions 29 and 30, insures that as the buried contacts are brought close together, to meet stringent design requirements of VLSI devices, current leakage between the buried contacts will not occur.

As illustrated in FIG. 2, conductive layers 33 and 35 overlie the entire contact opening in pad oxide layer 22. However, as a result of slight misalignment, or where it is desired to form large contact openings in pad oxide layer 22 to accommodate for example, contact by a second conductive layer, conductive layers 33 and 35 may overlie only a portion of the principle surface of the well region within the contact opening.

Figure 3:
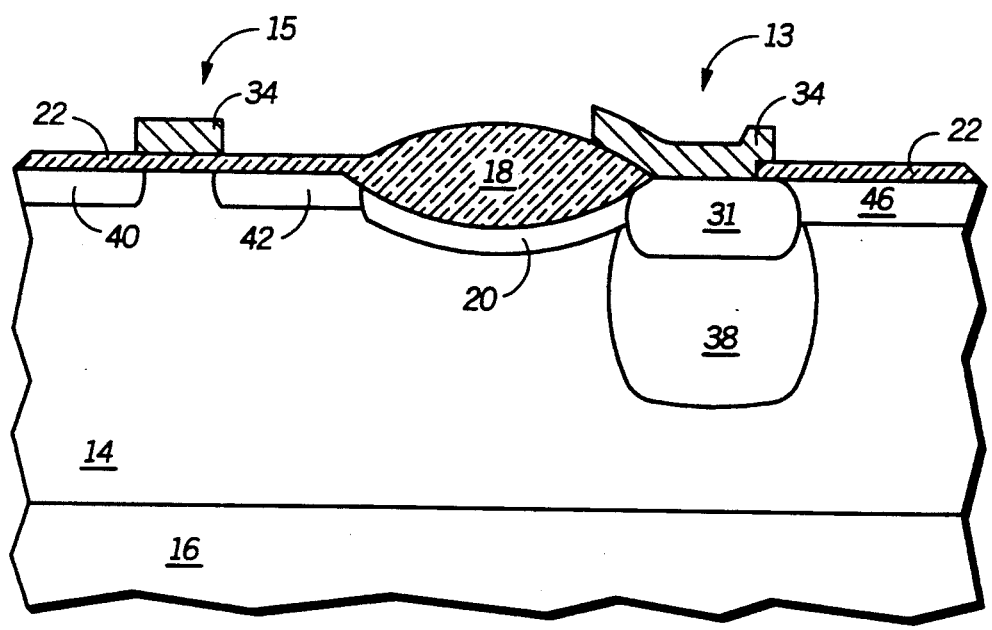
FIG. 3 is a cross sectional view taken along the line 3—3 of FIG. 1 illustrating a portion of the circuit having a buried contact formed in accordance with the invention and a transistor separated from the buried contact by a field isolation region.

FIG. 3, illustrates, in cross section, a region of circuit portion 10 taken along the line 3—3 of FIG. 1. Shown in FIG. 3 is a portion of field isolation region 18 separating buried contact 13 from transistor 15. As can be understood by referring to FIG. 1, conductive layer 34 forms the gate of transistor 15 at one end and makes contact to source-drain region 46 through buried contact 13 at the opposite end. A punch-through protection region 38 electrically isolates buried contact 13 from source-drain region 42. A portion of channel stop 20 extends between doped contact region 31 and drain region 42. Thus, buried contacts 11, 12 and 13 are electrically isolated from each other and from source-drain regions of adjacent transistors by the punch-through prevention regions formed in accordance with the invention. Those skilled in the art will recognize that only a portion of an integrated circuit structure is shown in FIG. 1 and that many different layout arrangements having punch-through protected buried contacts are possible.

Figure 4:
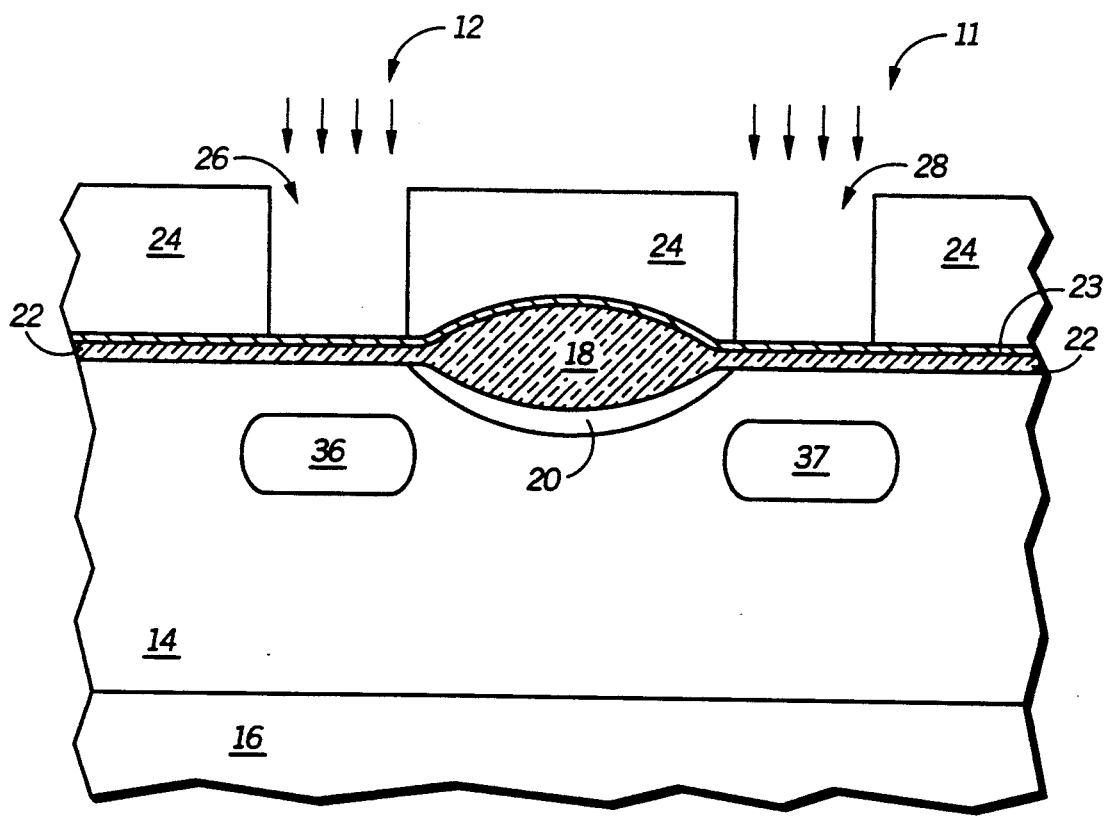
FIGS. 4 and 5 illustrate, in cross section, process steps in accordance with the invention.
Figure 5:
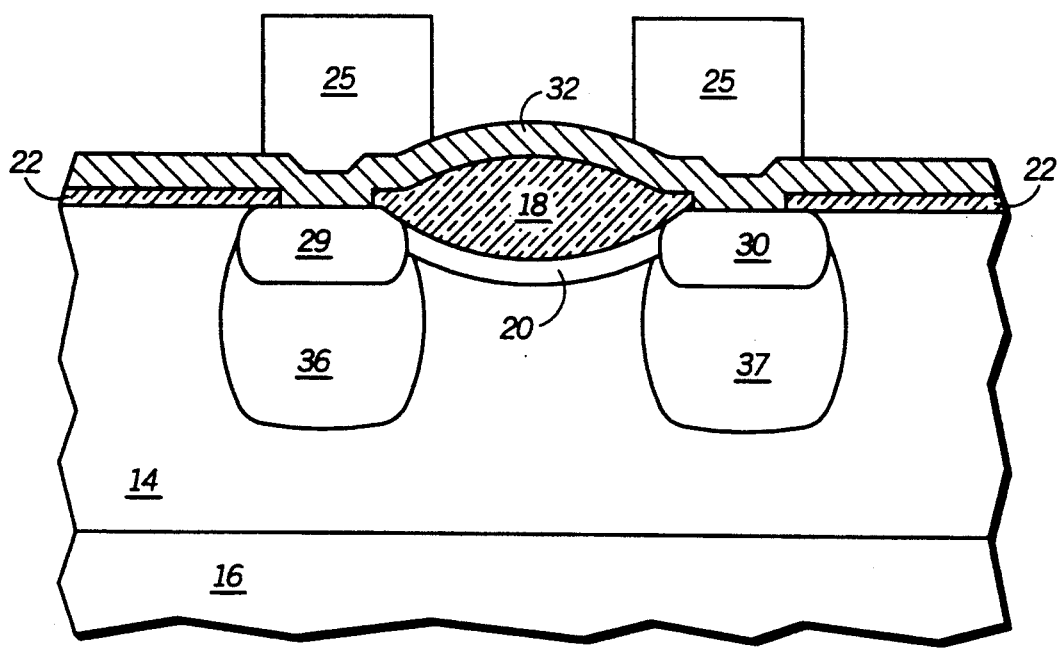

One embodiment of a process used to fabricate circuit portion 10 is shown in FIGS. 4-5. For purposes of illustration, only the fabrication of features shown in FIG. 2, i.e., adjacent buried contacts 11 and 12 will be described. Those skilled in the art will realize that similar techniques apply to the fabrication of all features shown in FIG. 1. As shown in FIG. 4, contacts 11 and 12 are formed on opposite sides of a field isolation region 18 which is preferably a thick $SiO_2$ field oxide. An optional channel stop 20 may be formed in substrate 14 prior to forming field isolation region 18. In a preferred process, a thin pad oxide layer 22 is formed to serve as a screen for subsequent implants and can also function as a gate oxide layer in other parts of the circuit. After pad oxide layer 22 is formed, a first polysilicon layer 23 is deposited onto pad oxide layer 22. Next, a layer of photoresist 24 is provided and patterned using standard photolithographic techniques to form two contact openings 26 and 28 which will define doped regions 36 and 37.

Once the photoresist pattern 24 is in place, an ion implant is performed through first polysilicon layer 23 and pad oxide layer 22 to form punch-through prevention regions 36 and 37 in well region 14. Alternatively, portions of pad oxide layer 22, exposed by contact openings 26 and 28, can be etched exposing the principal surface of well region 14. If contact openings have already been formed in pad oxide 22, the impurity may be introduced via diffusion or other direct means. In a preferred process of the invention, a dopant impurity of the same conductivity type as well region 14 is introduced to form punch-through prevention regions 36 and 37, as shown in FIG. 4. The energy and dose of the implant can be adjusted to produce locally heavy doping under the buried contacts 11 and 12. For example, in the case of a p-type punch-through prevention region, a boron implant dose of about $1 \times 10^{12}$ to $1 \times 10^{14}$ ions per square centimeter, implanted at an energy of about 160 to 260 KeV can be used to form a region which, following the completion of all thermal process cycles, has a peak concentration at about 450 to 650 nanometers below the principal surface of the substrate. Those skilled in the art will realize that the particular dose and energy ranges given above will result in a dopant concentration in the substrate that is suitable for performing the task of punch-through prevention in the illustrative embodiment described herein, and that given different device device junction depth requirements, dopant conductivity and structural arrangement, different dose and energy combinations would be used.

After forming punch-through prevention regions 36 and 37, a conductive layer 32 is formed by depositing a second layer of conductive material to overlie first polysilicon layer 23, as shown in FIG. 5. The second layer of conductive material is preferably chemical vapor deposited (CVD) polysilicon doped with a n-type dopant either during deposition, by introduction of dopant gases into the CVD system during deposition, or alternatively, by introducing a dopant after conductive layer 32 has been formed. Alternatively, the second layer of conductive material can be a refractory metal such as tungsten, cobalt, titanium, molybdenum, tantalum and the like.

Next, doped contact regions 29 and 30 are formed, in a preferred embodiment, by diffusing dopant atoms from conductive layers 32 into well region 14 below the contact openings in pad oxide layer 22, as shown in FIG. 5. The final dopant concentration gradient and spatial distribution of dopant atoms in punch-through prevention regions 36 and 37 below contact regions 29 and 30 is determined by the specific implant dose and energy and the particular thermal process cycles used in the process. During the thermal processing used to form contact regions 29 and 30, the boron atoms implanted into the substrate to form punch-through protection regions 36 and 37 diffuse deeper into well region 14 below contact regions 36 and 37. The final boron dopant distribution in well region 14 is determined by subsequent thermal processing; however, the boron dopant concentration in punch-through prevention regions 36 and 37 is remains greater than that of well region 14 such that a PN junction is formed between contact regions 29 and 30 and punch-through prevention regions 36 and 37.

For example, having formed punch-through prevention regions 36 and 37 with the boron implant described above, and wherein conductive layer 32 is polysilicon n-doped with phosphorus to a sheet resistance of about 25 to 35 $\Omega$/square, dopant atoms are diffused from conductive layer 32 into the substrate by a thermal process carried out at about 900° to 1000° C. for about 1 to 2 hours. Following the formation of contact regions 29 and 30, a photoresist pattern 25 is defined, as shown in FIG. 5, and conductive layer 32 is anisotropically etched to form patterned conductive layers 33 and 35 shown in FIG. 2. Source-drain regions 42 and 44 are preferably formed in a conventional manner by defining a source-drain photoresist pattern to protect p-channel devices (not shown) and implanting a n-type dopant such as phosphorus or arsenic into well region 14. The thermal processing diffuses the boron dopant into the substrate forming a PN junction about 250 to 350 nanometers below the principal surface of the substrate.

A particular advantage of the present invention includes the formation of punch-through prevention regions in the immediate vicinity of the buried contacts and deeper than the source-drain regions. Processes of the prior art tend to over-dope the well region in which source-drain regions are formed which degrades transistor performance. Another commonly used technique is to increase the doping in the channel stop under the field isolation region, however this has not proven to be effective in stopping current leakage between closely spaced buried contacts. The electric field from the locally higher boron doping in punch-through prevention regions 36 and 37 will pinch-off the depletion regions extending from the two polysilicon nodes 11 and 12 under the field isolation region, thus aiding in lateral punch-through protection. Regions 36 and 37 also help prevent punch-through to a buried layer or to substrate 16, being of opposite conductivity from that of well region 14. The method of the present invention provides lateral and vertical punch-through protection without additional masks while maintaining a shallow doping profile in the active device regions such as source and drain regions 40 and 42. Computer simulated doping profiles and experimental results, described below, have demonstrated that such regions as 36 and 37 situated below the contact region deep in the well region will prevent lateral and vertical electrical punch-through between adjacent buried contacts.

Figure 6:
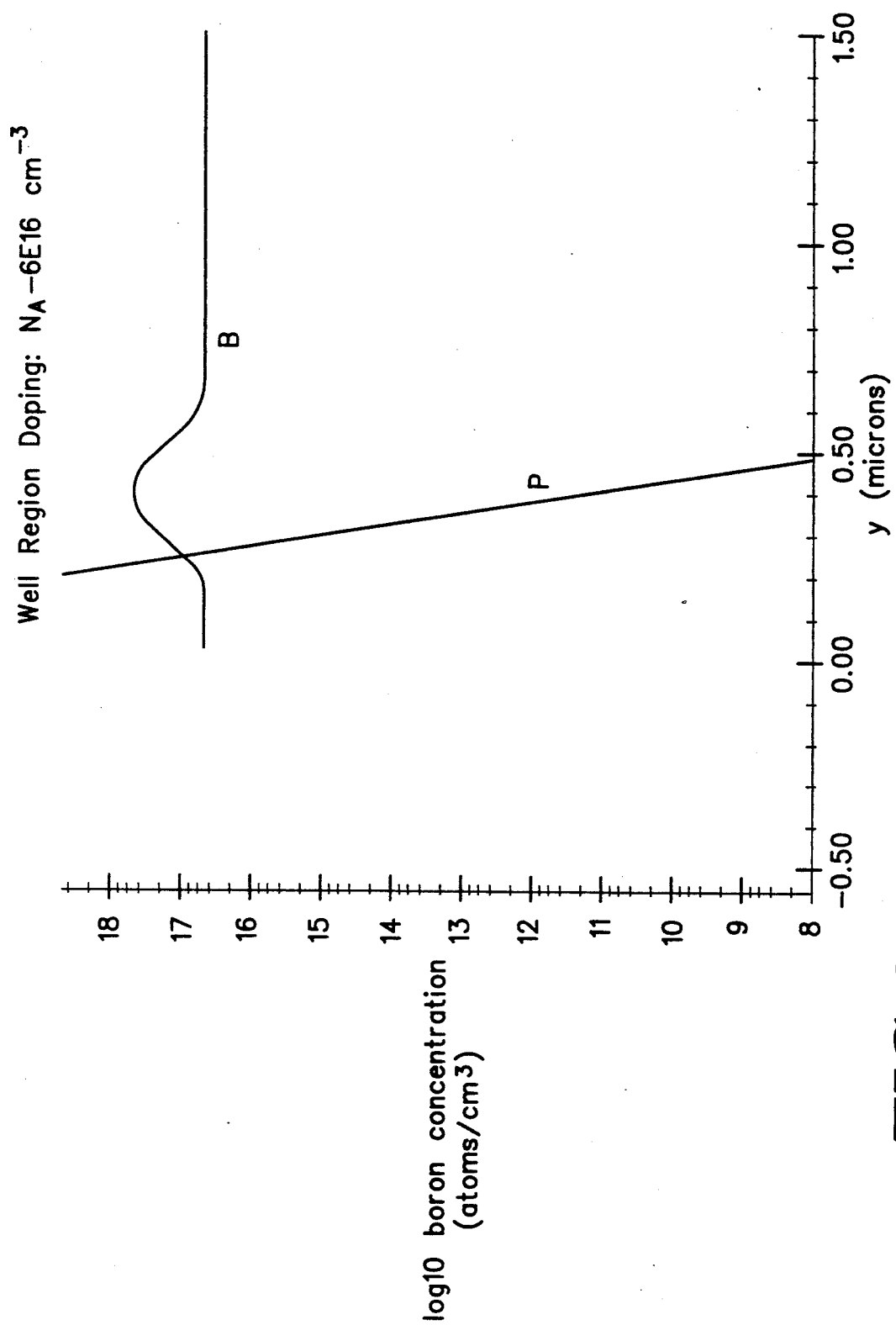
FIG. 6 is a computer generated plot illustrating the doping profile through a buried contact formed in accordance with the invention.

Shown in FIG. 6 is a computer simulation plot of the doping profile through the buried contact structure. The plot represents the dopant concentration in the well region as a function of depth into the well region. The simulation program estimates the dopant profiles in the well region after all of the implantation and thermal cycling is complete and thus is representative of the actual dopant profiles in a device upon completion of the fabrication sequence. In the plot, the boron dopant concentration curve is labeled as B and the phosphorus dopant concentration curve is labeled as P. It is apparent from the plot that the peak boron concentration lies well below the surface of the well region (denoted as 0.00 on the x axis) and also below the peak phosphorus concentration at about 500 nanometers from the surface.

Figure 7:
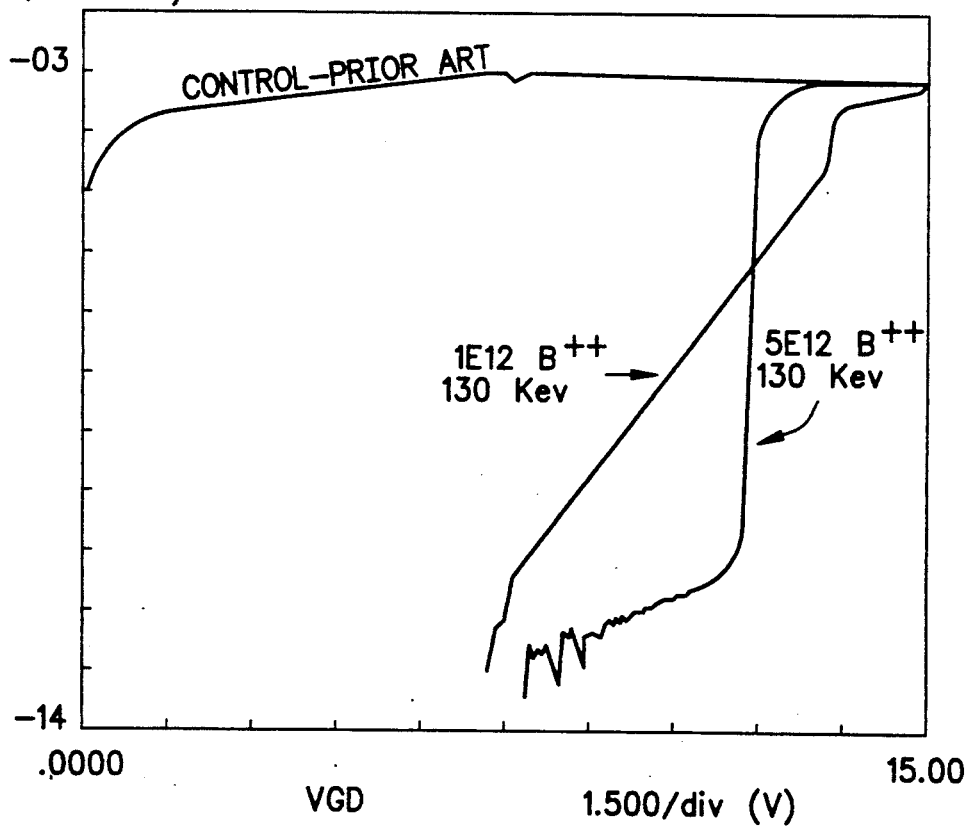
FIG. 7 is a plot of experimental data taken from a structure formed in accordance with the invention showing leakage current versus voltage across the field isolation region for different punch-through prevention doping concentrations.

Shown in FIG. 7 is a plot of leakage current beneath field isolation region 18 between adjacent buried contacts as a function of voltage across the field isolation region. The three curves shown in the plot represent different doping concentrations in punch-through protection regions 36 and 37. The top curve, labeled "Control-Prior Art" represents leakage current in a device formed in accordance with the prior art which lacks punch-through protection. As can be observed from the plot, a significant leakage current is constantly present even at a very low voltage across the field isolation region in the prior art device. Two curves representing leakage current data at different dopant concentrations in punch-through protection regions 36 and 38 are also shown in the plot and are labeled with the implant dose used to form the regions. A significant reduction in leakage current at voltages below about 12 volts is evident in the plot. Further, the sensitivity of leakage current reduction to the specific dose used to form the regions is demonstrated by the reduction in leakage current between about 9 and 12 volts with an increase in dose from $1 \times 10^{12}$ to $5 \times 10^{12}$ ions per square centimeter.

Thus it is apparent that there has been provided, in accordance with the invention, a semiconductor device having punch-through protected buried contacts which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other doping techniques such such as focused molecular beam deposition can be used. Additionally, trench isolation structures can be used in place of the field isolation regions shown in the FIGURES. Furthermore, other dielectric materials can be used such as silicon nitride, oxide/nitride composites, oxynitrides, and the like. It is therefore intended to include within the invention all such variations and modifications as fall within the scope of the appended claims and equivalents thereof.

We claim:

1. A method for forming a semiconductor device comprising:

providing a semiconductor device region of a first conductivity type having a principal surface and having a first and second active regions therein separated by an isolation region;

forming subsurface punch-through prevention regions of the first conductivity type in selected portions of the first and second active regions;

forming a doped conductive layer having a portion in intimate contact with the principle surface; and forming doped contact regions of a second conductivity type in the first and second active regions adjacent to the isolation region extending from the principle surface to the subsurface punch-through prevention regions wherein the subsurface punch-through prevention regions surround a lower portion of the doped contact regions and are separated from the principle surface by the doped contact regions.

2. The method of claim 1 further comprising forming source-drain regions of the second conductivity type in the first and second active regions adjacent to the doped contact regions.

3. The method of claim 1 wherein the step of forming the doped contact regions is carried out by diffusing dopant directly from the doped conductive layer into the first and second active regions.

4. A method for forming a semiconductor device comprising:

providing a semiconductor device region of a first conductivity type having a principal surface and having a first and second active regions therein separated by an isolation region;

forming a dielectric layer overlying the first and second active regions;

forming a patterned mask layer overlying the semiconductor device region having openings aligned to a portion of the first and second active regions adjacent to the isolation region;

introducing a dopant of the first conductivity type into the first and second active regions through the openings to form subsurface punch-through prevention regions in the active device region;

etching contact openings in the dielectric layer using the openings of the mask layer as etch masks to expose the active region;

forming a conductive layer overlying semiconductor device region and extending into the contact openings to contact the principle surface; and diffusing dopant atoms of a second conductivity type from the conductive layer into the active region to form contact regions separating the punch-through prevention regions from the principle surface.

5. The method of claim 4 further comprising etching the conductive layer after diffusing dopant atoms to form a patterned conductive layer contacting at least a portion of the exposed active device region.

6. The method of claim 5 further comprising forming source-drain regions in the first and second active device regions.

7. A method for forming a semiconductor device:

providing a n-type single crystal silicon substrate having an p-type well region formed therein, the well region having a principal surface;

forming a field oxide region in the well region separating the well region into first and second active regions;

oxidizing the principle surface to form a dielectric layer overlying the first and second active regions;

forming a photoresist mask layer overlying the semiconductor well region having openings aligned to a portion of the first and second active regions adjacent to the field oxide region;

implanting boron atoms at an energy of about 160 to 260 KeV and a dose of about $1 \times 10^{12}$ to $1 \times 10^{14}$ ions per square centimeter into the first and second active regions through the openings to form substrate punch-through prevention regions at a depth of about 250 to 350 nanometers in the well region;

etching contact openings in the dielectric layer using the openings in the photoresist mask layer as etch masks to expose a portion of the principle surface;

removing the photoresist mask layer;

forming a phosphorous-doped polysilicon layer to overlie at least a portion of the field oxide layer and having a portion thereof extending into at least one of the openings to contact the principle surface; and diffusing phosphorus atoms from the polysilicon layer into the active region to form doped contact regions separating the punch-through prevention regions from the principle surface.

8. The method of claim 7 further comprising etching the polysilicon layer after diffusing phosphorus atoms to form a patterned conductive layer contacting at least a portion of the exposed principle surface in contact openings.

9. The method of claim 8 further comprising implanting phosphorus atoms into the well region to form n-type source-drain regions.

* * * * *